United States Patent [19]

Mukai et al.

[11] Patent Number: 5,441,615
[45] Date of Patent: Aug. 15, 1995

[54] SPUTTERING APPARATUS AND METHOD

[75] Inventors: Yasuo Mukai, Yokohama; Hideo Takakura, Hiratsuka, both of Japan

[73] Assignee: Canon Kabushiki Kaisha, Tokyo, Japan

[21] Appl. No.: 350,591

[22] Filed: Dec. 6, 1994

Related U.S. Application Data

[63] Continuation of Ser. No. 970,783, Nov. 3, 1992, abandoned.

[30] Foreign Application Priority Data

Nov. 11, 1991 [JP] Japan .................. 3-29503

[51] Int. Cl.⁶ .................. C23C 14/34; C23C 14/56
[52] U.S. Cl. .................. 204/192.12; 204/298.07; 204/298.11; 204/298.25; 204/298.26
[58] Field of Search .................. 204/192.12, 298.07, 204/298.11, 298.23, 298.25, 298.26

[56] References Cited

U.S. PATENT DOCUMENTS

| | | | |
|---|---|---|---|
| 4,851,095 | 7/1989 | Scobey et al. | 204/192.12 |
| 4,981,566 | 1/1991 | Wurczinger | 204/192.13 |
| 5,229,194 | 7/1993 | Lingle et al. | 428/216 |
| 5,364,481 | 11/1994 | Sasaki et al. | 118/718 |

*Primary Examiner*—Aaron Weisstuch

[57] ABSTRACT

The sputtering apparatus includes: at least one film-forming vacuum chamber in which a plurality of sputtering targets and a like plurality of box-shaped deposition-shield members are disposed, each deposition-shield surrounding the corresponding target in such a manner that each of the targets faces a corresponding substrate, each deposition-shield member having an opening which enables sputtered particles to travel from the target to the corresponding substrate.

The arrangement of the sputtering apparatus may be such that the substrate is supported by a holder and the substrate holder is placed facing the opening provided in a wall of the deposition-shield member, wherein the area of the substrate holder is larger than that of the opening of the deposition-shield member, and a part of the area of the substrate holder which faces the wall of the deposition-shield member overlaps a closed portion of the deposition-shield member when viewed in plan.

8 Claims, 4 Drawing Sheets

SPUTTERING APPARATUS AND METHOD

This application is a continuation of application Ser. No. 07/970,783 filed Nov. 3, 1992, now abandoned.

BACKGROUND OF THE INVENTION

1. Field of the Invention

The present invention relates to a sputtering apparatus employed for producing a semiconductor device, an optical disk, a magnetic-recording medium, a liquid-crystal display device, a solar battery, and the like.

2. Description of Related Art

Conventionally, in a process of producing a semiconductor device, an optical disk, a magnetic-recording medium, a liquid-crystal display device, a solar battery, and the like, a sputtering apparatus is employed to form a functional thin-film or a protective film which forms part of the above-described products. To form a multi-layer film structure, what is commonly performed is: a sputtering unit is exclusively and independently provided for forming each layer of the film; or a plurality of different targets are provided in a single apparatus in order to change the pressure and other formation factors of each film, and sputtering is executed by plasma discharging at every film formation step in sequence. However, these methods have a lower efficiency in mass production. Consequently, there recently has been proposed an in-line sputtering apparatus comprising a plurality of film-forming chambers each having an exclusive exhaust pump for each target, and the film-forming chambers are connected to each other via gates. This in-line sputtering apparatus has drawn attention due to its superior productivity.

However, a conventional in-line sputtering apparatus has comprised, for every target, an exclusive film-forming chamber equipped with a gate and an exclusive high-vacuum pump such as a cryopump or a turbo-pump so as to allow setting of the sputtering pressure arbitrarily and independently for each different target. Due to this configuration, which has required a number of film-forming chambers, gates, high-vacuum pumps, and the like, the cost of the apparatus is high.

FIG. 4 is a schematic illustration showing a representative configuration of a conventional in-line sputtering apparatus.

In FIG. 4, film-forming vacuum chambers 417, 418, and 419 are provided, in order, between an input chamber 405 and an output chamber 406. The input chamber 405 and the film-forming vacuum chamber 417, and the vacuum chamber 419 and the output chamber 406 are connected by gate valves 407 and 408, respectively. Likewise, the vacuum chambers 417 and 418, and the vacuum chambers 418 and 419 are connected by gate valves 415 and 416, respectively.

A cryopump 409, a sample holder 410, and a deposition shield member 414 are provided in each of the film-forming vacuum chambers 417 to 419. Each sputtering process is performed by a respective one of the different targets 401 to 403 to deposit a film on the corresponding sample in each of the film-forming vacuum chambers 417 to 419 to which Ar gas for performing the sputtering is supplied via each of the MFCs (mass-flow controllers) 1 to 3.

However, there has been a drawback in the conventional in-line sputtering apparatus of the prior art such that the apparatus has required a number of expensive components such as exhaust pumps and gates to complete a single apparatus, which has resulted in making the price of the apparatus expensive. In addition, the above apparatus cannot always form the multi-layer film effectively.

SUMMARY OF THE INVENTION

In view of the above-described problems of the prior art, the present invention is aimed at providing a sputtering apparatus which can form a multi-layer film effectively. In addition, another object of the present invention is to provide an inexpensive sputtering apparatus.

The sputtering apparatus comprises: at least one film-forming vacuum chamber, in which a plurality of sputtering targets is provided; and a like plurality of box-shaped deposition-shield members disposed in the vacuum chamber, each deposition-shield member surrounding the corresponding target in such a manner that each of the targets faces a corresponding substrate, each deposition-shield member having an opening which enables sputtered particles to travel from the target to the corresponding sample substrate.

In the present invention, a preferable configuration of the sputtering apparatus is described as: the substrate is supported by a substrate holder which is placed facing the opening provided in a wall of the deposition-shield member, wherein the area of the substrate holder is larger than that of the opening of the deposition-shield member, and a part of the area of the substrate holder which is disposed to face the wall of the deposition-shield member overlaps a closed portion of the deposition-shield member when viewed in plan.

In addition, an independent inlet-hole for supplying sputtering-gas may be provided in each deposition-shield member, and an arbitrary amount of sputtering gas flow can be independently controlled for every deposition-shield member. Furthermore, supply of the sputtering gas to each deposition-shield member can be achieved by a mass-flow controller independently provided at each target. Each mass-flow controller can be controlled by an independently provided automatic-pressure controller to stabilize the pressure of the gas.

In the apparatus of the present invention, a plurality of targets are provided in a single film-forming vacuum chamber; therefore, the number of expensive parts such as exhaust pumps and gates can be reduced.

In the sputtering apparatus of the present invention, sputtering from a plurality of targets can be achieved in a single film-forming vacuum chamber. Although the sputtering apparatus is of the in-line type, a high-vacuum pump can be incorporated in a single-line system due to the foregoing configuration; therefore, the number of gate valves can be also reduced. Accordingly, forming a multi-layer film with a high production efficiency can be achieved, and furthermore, an inexpensive sputtering apparatus can be provided.

Furthermore, the area of the substrate holder is designed to be larger than that of the opening of the deposition-shield member so as to provide overlapping with the closed area thereof. The above configuration of the apparatus helps prevent sputtered particles, which are ejected from each target, from scattering and dispersing to the outside of each deposition-shield member provided with each target. Communication between the inside and outside of the deposition-shield member can be diminished by placing the substrate holder and the deposition-shield member closer.

DESCRIPTION OF THE PREFERRED EMBODIMENTS

A detailed description of preferred embodiments of the present invention will now be given in conjunction with the accompanying drawings.

Figure 1:
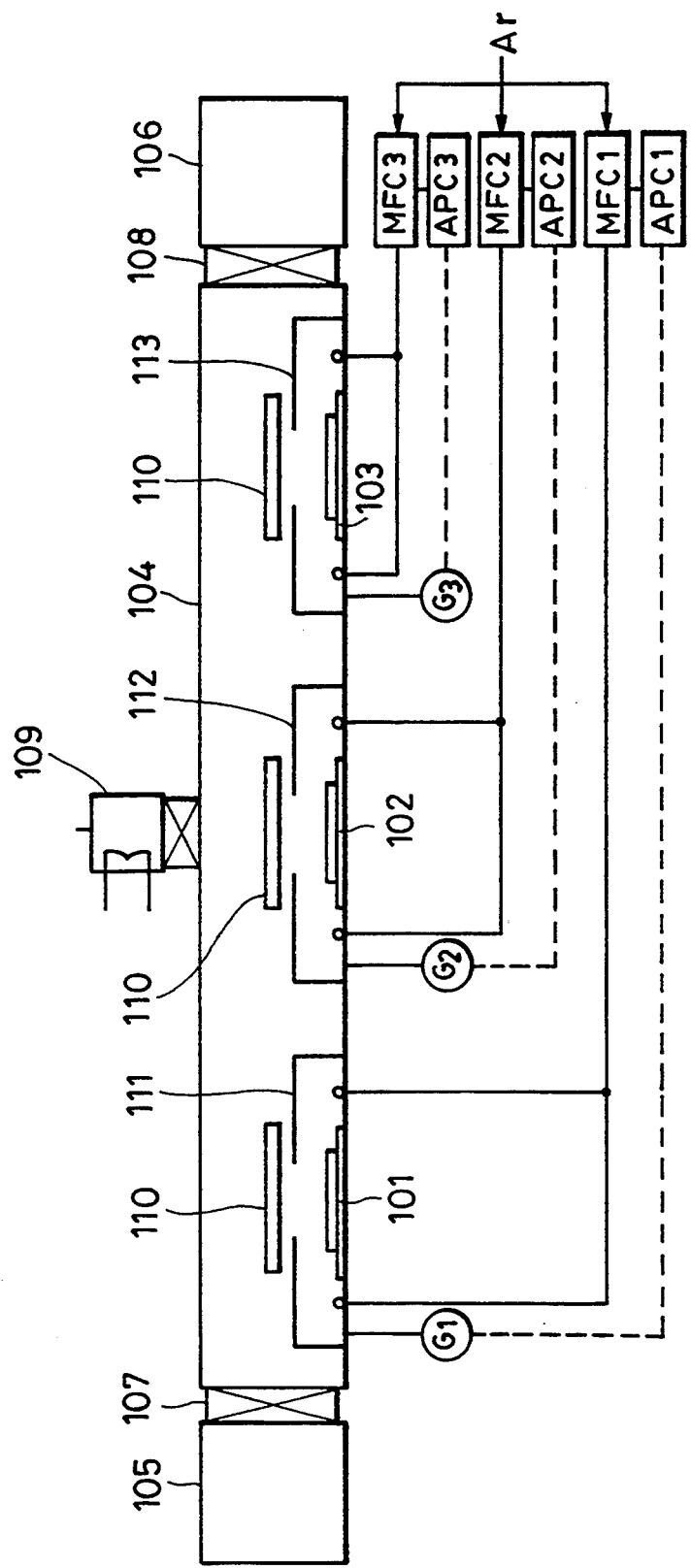
FIG. 1 is a schematic illustration of an example of a sputtering apparatus of the present invention.

FIG. 1 is a schematic illustration of one example of the sputtering apparatus according to the present invention.

As shown in FIG. 1, the film-forming vacuum chamber 104 is connected with an input chamber and an output chamber via gate valves 107 and 108, respectively. Three targets are accommodated in the film-forming vacuum chamber in which a cryopump 109 is installed and three different targets 101, 102, and 103 with three corresponding deposition-shields 111, 112, and 113 enclosing the respective targets are also provided. An opening is provided in each of the deposition-shields 111 to 113. The area of each opening is smaller than that of the substrate holder 110 which supports each substrate (not shown).

Ar gas is supplied, via mass-flow controllers MFC1, MFC2, and MFC3 into the respective chambers formed by the deposition-shields 111 to 113, whereat a substrate is disposed to face the corresponding target. The pressure in each such deposition-shield chamber is monitored by each of the vacuum gauges G1, G2, and G3. The pressure in each of the deposition-shield chambers 111 to 113 is detected by the corresponding vacuum gauges G1 to G3, and the respective automatic pressure-controllers APC1, APC2, and APC3 control the flow rate of the corresponding mass-flow controllers MFC1 to MFC3 so as to maintain the pressure at each deposition-shield member at a predetermined level. In each of the deposition-shield members 111 to 113, there is provided not only the target but also an electrode for performing the sputtering. In addition, a transfer mechanism to transfer each substrate holder 110 is provided in the film-forming vacuum chamber 104. Both intermittent transferring and continuous transferring are possible with the transfer mechanism, in which each substrate holder is transferred at a normal speed ranging between 1 and 1000 mm/min. during continuous transferring. In the sputtering apparatus of the present invention, although there are a plurality of targets 101 to 103, a single film-forming vacuum chamber is employed while eliminating the gate valves needed between each target as in conventional apparatus, and also a single cryopump 109 is used as a single-line system (a single or a plurality of vacuum pumps can be used if it is a single system). However, in this configuration, the gas pressure close to the respective targets 101 to 103 would be at the same level. Accordingly, in the present invention, the following five different adaptations were made to each of the deposition-shield members 111 to 113 and to each substrate holder 110 so that the pressure at each of the respective targets can be set independently and arbitrarily.

(1) An opening for enabling sputtered particles to travel from each target to the corresponding substrate is provided in each of the box-type deposition-shield members 111 to 113 which are disposed to enclose each of the targets 101 to 103.

(2) The substrate holder 110 for fixedly mounting the substrate has a plate-shaped configuration of a rectangle, a circle, or the like. The area of each substrate is greater than that of the opening of the respective deposition-shield members 111 to 113 such that each substrate holder and closed portion of the deposition-shield member, which each substrate holder faces, overlap each other. This overlapping configuration prevents the sputtered particles, ejected from each target, from scattering outside the corresponding deposition-shield member. Furthermore, the level of communication of each deposition-shield member can be smaller.

(3) The overlapping length of each substrate holder and the closed portion of the corresponding deposition-shield member is 20 mm or more at the minimum overlapping area and more preferably is 50 mm or more. The clearance between each substrate holder and the corresponding deposition-shield member is designed to range between 1 mm and 20 mm, and more preferably between 1 mm and 10 mm so as to obtain a sufficiently smaller communication between the inner and outer portions of each deposition-shield member.

(4) An independent sputtering gas inlet hole (not shown) is provided for each of the targets 101 to 103 in each of the respective deposition-shield members 111 to 113, whereby the flow rates of the sputtering gases flowing through each inlet can be arbitrarily controlled. Due to this configuration, sputtering controlled by an independently controllable flow rate at every target is enabled.

(5) Setting of the flow rate of each of the deposition-shield members 111 to 113 in item (4) can be executed by the mass-flow controllers MFC1 to MFC3. In addition, the sputtering apparatus has a configuration equipped with automatic-pressure controllers APC1 to APC3 to control the respective mass-flow controllers MFC1 to MFC3 so as to stabilize the pressure at each of the respective targets 101 to 103.

In the example of the present invention, when the sputtering apparatus has the above-mentioned five configurations, communication between the respective deposition-shield members 111 to 113 disposed at each of the targets 101 to 103 can be made smaller. Furthermore, the pressure around each of the respective targets 101 to 103, a plurality of which are disposed in the single film-forming vacuum chamber 104, can be set arbitrarily and maintained, whereby a plurality of processes can be achieved in the film-forming vacuum chamber 104.

Figure 2:
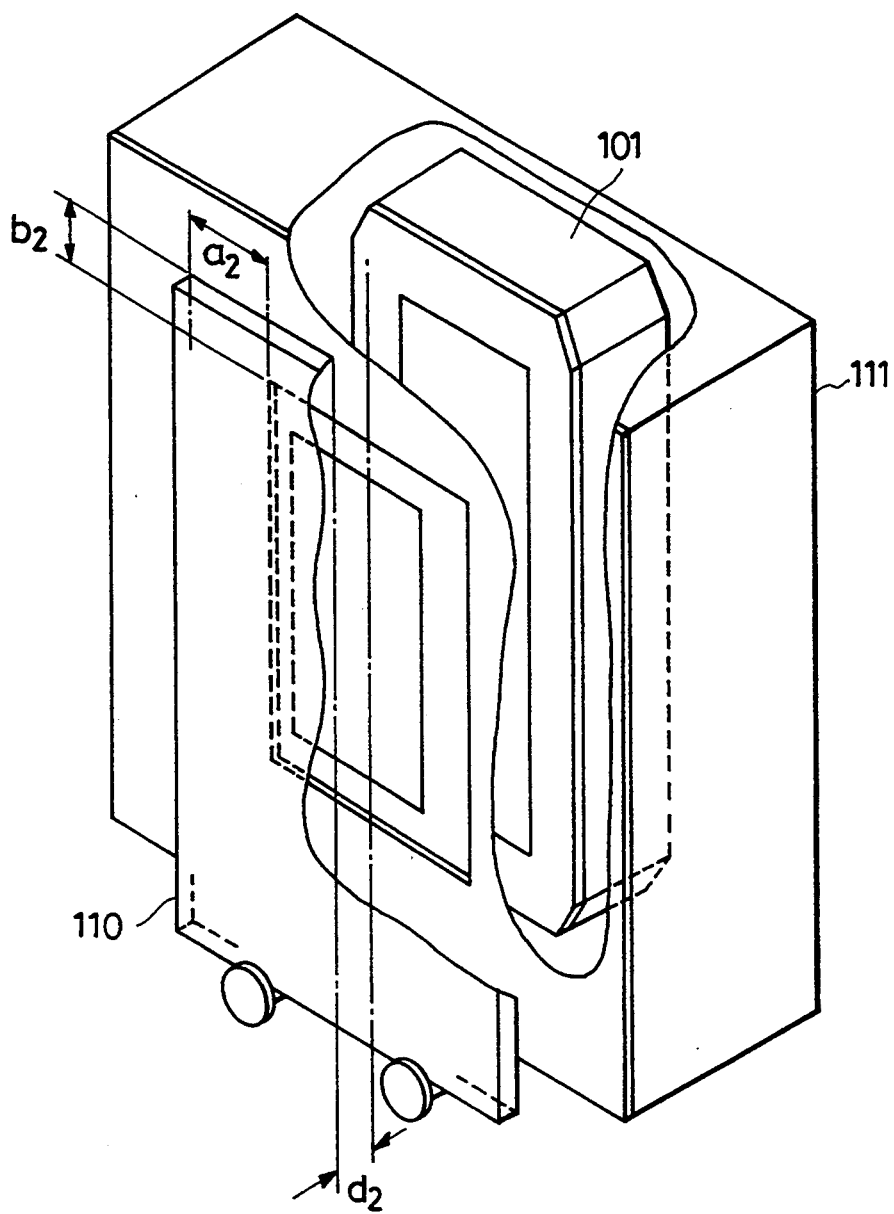
FIG. 2 is a schematic illustration of one example of a deposition-shield member and a substrate holder employed for the sputtering apparatus of the present invention.

FIG. 2 is a perspective view showing the shape of each of the deposition-shield members 111 to 113 and the substrate holders 110 shown in FIG. 1. In the example of the present invention, identically shaped deposition-shield members are used with all the targets 101 to 103, and also all the substrate holders have identical sizes.

In the example of the present invention shown in FIG. 1, a rectangular opening is formed in each deposition-shield member which encloses a substantially rectangular target 101, and each substrate holder 110 is substantially rectangular. The length $a_2$ and width $b_2$ of the overlapped area of the substrate holder 110 and the corresponding closed position of the deposition-shield member are 100 mm and 60 mm, respectively. The clearance $d_2$ between the faces formed by the closed portion of the deposition-shield member and the substrate holder 110 is 6 mm. By applying the above measurements to the substrate holders and the deposition-shield members, the communication between the inner and outer portions of the deposition-shield member becomes sufficiently small.

A description of the method of forming a film by the sputtering apparatus of the present invention will be given below in conjunction with FIG. 2.

The substrate holders 110 were transported into the film-forming vacuum chamber 104 from the input chamber 105 via the gate valve 107, and each of the holders 110 was placed in front of a respective deposition-shield member 111 to 113. Under the above conditions, every zone in the film-forming vacuum chamber 104 was maintained at a high-vacuum level ($10^{-3}$ Pa or less) by means of the cryopump 109.

Subsequently, the automatic-pressure controllers APC1, APC2, and APC3 were set to 0.5 Pa, 0.8 Pa, and 1.2 Pa, respectively, to maintain the pressure close to the respective targets at the above predetermined pressures. Then, the respective mass-flow controllers MFC1, MFC2, and MFC3 were actuated and indicated the flow rates of the sputtering gas as approx. 10 cc/min., approx. 30 cc/min., and approx. 80 cc/min., respectively, during which time the flow-rate variability was insubstantial. Then, the vacuum gauges G1 to G3 indicated respectively 0.5 Pa, 0.8 Pa, and 1.3 Pa, which are substantially equal to the values of the preset pressures inputted to the respective automatic-pressure controllers APC1, APC2, and APC3.

As a result, it is possible for the sputtering apparatus to maintain independently the pressure close to each target at an arbitrary level in the single film-forming vacuum chamber even if a plurality of targets are provided in the chamber without intervening gate valves between each target. Consequently, the sputtering apparatus of the invention has made it possible to form a laminated film on each substrate disposed on the sample holder by means of sputtering of the respective targets 101, 102, and 103.

It is obvious that even a conventional prior art sputtering apparatus of-in-line type, in which an exclusive film-forming chamber with a high-vacuum pump is provided for every target, is able to maintain the pressure surrounding each target at an arbitrary level. In the embodiment of the present invention, however, the number of film-forming vacuum chambers, high-vacuum pumps, and gate valves, which are the essential components to configure a sputtering apparatus, has been dramatically reduced.

FIG. 1 is a table showing the number of expensive parts required for the preferred embodiment of the present invention compared with that required for the prior art to perform the same level of processing as the apparatus of the present invention.

TABLE 1

| The number of expensive parts required for each apparatus | | |
|---|---|---|
| | Prior Art | Present Inv. |
| Vacuum Chamber | 3 | 1 |

TABLE 1-continued

| The number of expensive parts required for each apparatus | | |
|---|---|---|
| | Prior Art | Present Inv. |
| High-Vacuum Pump | 3 | 1 |
| Gate Valve | 4 | 2 |
| Mass-Flow Controller | 3 | 3 |

Figure 3:
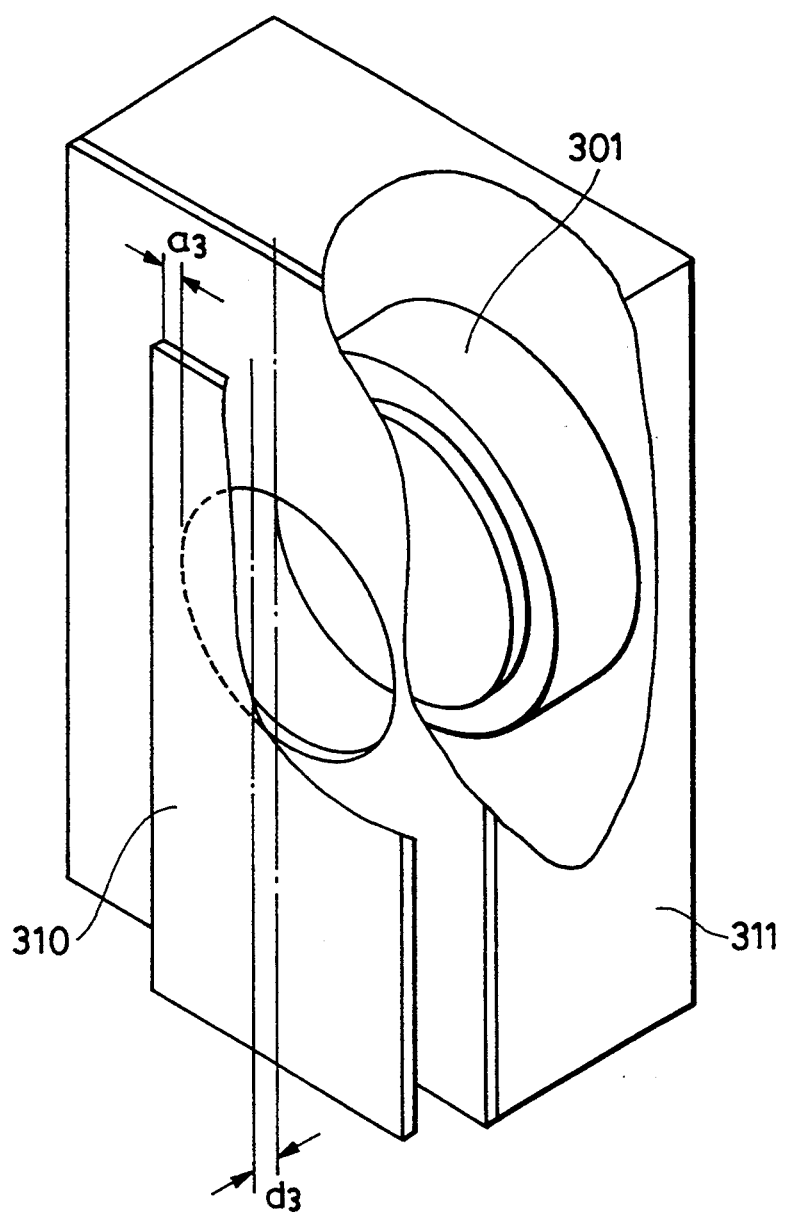
FIG. 3 is a schematic illustration of another example of a deposition-shield member and a substrate holder employed for the sputtering apparatus of the present invention.
Figure 4:
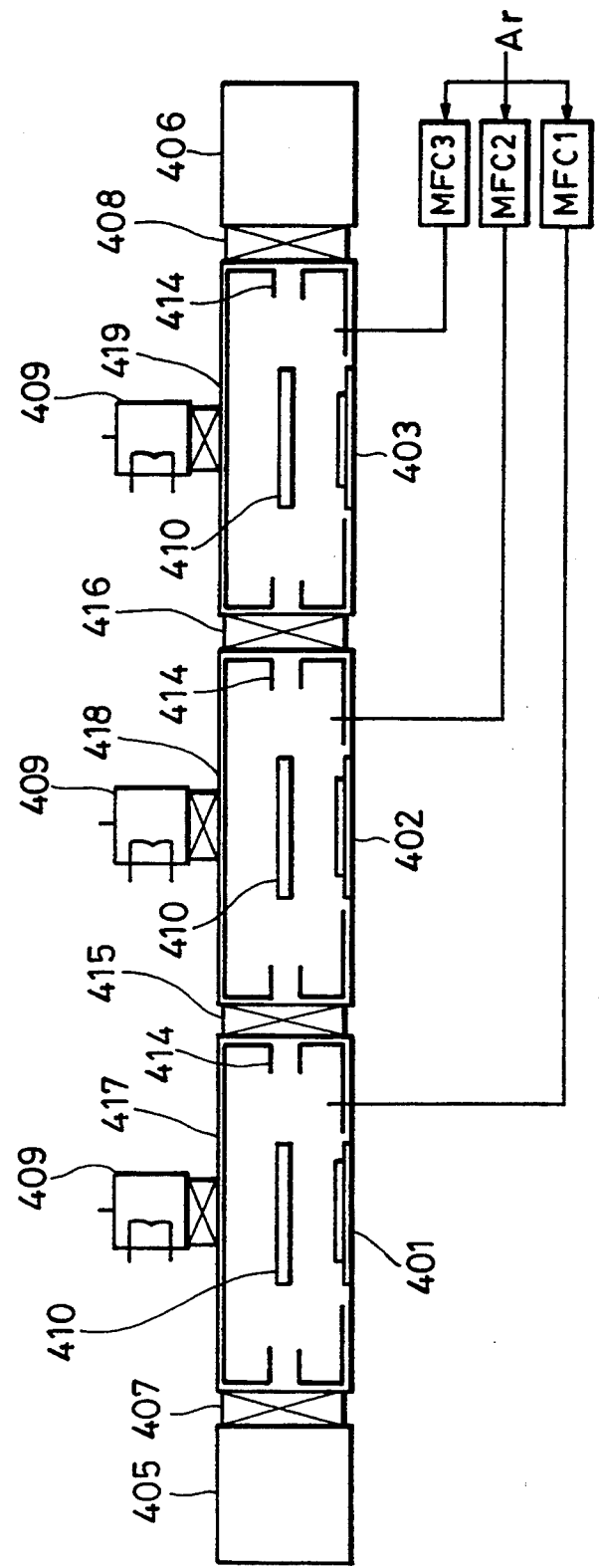
FIG. 4 is a schematic illustration of a conventional sputtering apparatus of the prior art.

FIG. 3 is a perspective view of another deposition-shield member and substrate holder used in a sputtering device of the invention.

As shown in FIG. 3, a disk-shaped target 301 is used, and accordingly, the shape of the opening of the deposition-shield member 311 is modified to be circular. The other components of this sputtering apparatus are identical with those shown in FIG. 2.

In FIG. 3, a minimum overlapping length $a_3$ between the opening, formed in the deposition-shield member 311, and the substrate holder 310 was 60 mm, and the clearance $d_3$ between the closed portion of the deposition-shield member and the substrate holder 310 was 6 mm. The automatic-pressure controllers APC1, APC2, and APC3 were set to be 0.5 Pa, 0.8 Pa, 1.2 Pa, respectively, in the same manner as the example described above. Then, the respective mass-flow controllers MFC1, MFC2, and MFC3 were actuated and indicated the flow rates of the sputtering gas as approx. 5 cc/min., approx. 25 cc/min., and approx 95 cc/min., respectively, and the pressure at each deposition-shield member reached the preset level and was stabilized. Accordingly, when the deposition-shield members and substrate holder shown in FIG. 3 are employed in the sputtering apparatus, a stable sputtering of each target was also successfully enabled and effective formation of a thin film laminate was achieved.

What is claimed is:

1. A sputtering apparatus comprising:
    a film-forming vacuum chamber connected to an evacuating pump, said film-forming vacuum chamber containing a plurality of sputtering targets;
    a plurality of deposition-shield members disposed in said film-forming vacuum chamber, wherein each said deposition-shield member surrounds a corresponding target so that each of said targets faces a corresponding substrate holder, and each said deposition-shield member having an opening in a wall thereof thereby allowing particles to be sputtered from said target to a corresponding substrate which is supported by the substrate holder; and
    a gas supply means for supplying a sputtering gas independently from a mass flow controller engaging with an automatic pressure controller provided so as to correspond to each space surrounded by corresponding deposition-shield members and substrate holders;
    wherein each said substrate holder is placed sufficiently close to the respective opening provided in a wall of the corresponding deposition-shield member so as to assist pressure control in each of said spaces.

2. A sputtering apparatus as defined in claim 1, wherein the minimum length of the overlapping area between said substrate holder and the confronting closed portion of the deposition-shield member is 20 mm or more.

3. A sputtering apparatus as defined in claim 1, wherein the clearance between the surface of said substrate holder and said wall of said deposition-shield member is between 1 mm and 20 mm.

4. A sputtering apparatus according to claim 1, wherein a substrate entry chamber and a substrate exit chamber are respectively connected to said film-forming vacuum chamber.

5. A sputtering apparatus according to claim 4, wherein said substrate entry chamber and said exit chamber are connected to said film-forming vacuum chamber through a gate.

6. A sputtering apparatus according to claim 1, wherein evacuation of said film forming vacuum chamber is performed by a cryopump.

7. A sputtering apparatus according to claim 1, further comprising a transfer mechanism for transferring said substrate.

8. A sputtering method for forming a deposition-film on a substrate by using a sputtering apparatus in which a plurality of deposition-shield members surround corresponding targets, each shield having an opening enabling sputtered particles to be emitted from the respective target onto the substrate in the film-forming vacuum chamber connected to at least one vacuum means, wherein the pressure in each sputtering space formed by the corresponding deposition-shield member and the substrate is stabilized by changing the amount of gas flow from a corresponding mass flow controller in accordance with information provided by an automatic pressure controller so as to form a uniform deposited film on said substrate in each said sputtering space.

* * * * *

UNITED STATES PATENT AND TRADEMARK OFFICE
CERTIFICATE OF CORRECTION

PATENT NO. : 5,441,615
DATED : August 15, 1995
INVENTOR(S) : YASUO MUKAI, ET AL.

It is certified that error appears in the above-indentified patent and that said Letters Patent is hereby corrected as shown below:

ON TITLE PAGE

In [30] Foreign Application Priority Data:
"3-29503" should read --3-294503--.

In [56] References Cited, after Primary Examiner, insert:
--*Attorney, Agent, or Firm*—Fitzpatrick, Cella, Harper & Scinto--.

Signed and Sealed this

Fourteenth Day of May, 1996

Attest:

BRUCE LEHMAN

Attesting Officer         Commissioner of Patents and Trademarks